(12) United States Patent
Haswarey et al.

(10) Patent No.: US 8,382,503 B2
(45) Date of Patent: Feb. 26, 2013

(54) QUICK RELEASE RETENTION MECHANISM FOR SOCKETED MICROELECTRONIC DEVICES

(75) Inventors: Aslam H. Haswarey, Portland, OR (US); Mustafa H. Haswarey, Hillsboro, OR (US); Ridvan A. Sahan, Sunnyvale, CA (US); Rahima K. Mohammed, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 166 days.

(21) Appl. No.: 12/972,101

(22) Filed: Dec. 17, 2010

(65) Prior Publication Data
US 2012/0156913 A1 Jun. 21, 2012

(51) Int. Cl.
*H01R 13/62* (2006.01)
(52) U.S. Cl. .......................... 439/331; 439/72
(58) Field of Classification Search .............. 439/72, 439/68, 626, 330, 331
See application file for complete search history.

(56) References Cited

U.S. PATENT DOCUMENTS

| 5,486,982 | A | * | 1/1996 | Hsu ............................... 361/728 |
| 5,784,257 | A | | 7/1998 | Tata |
| 5,932,925 | A | | 8/1999 | McIntyre |
| 6,137,298 | A | | 10/2000 | Binns |
| 6,957,987 | B2 | * | 10/2005 | Ma et al. .................... 439/733.1 |
| 7,471,517 | B1 | | 12/2008 | Desrosiers et al. |
| 2007/0212905 | A1 | | 9/2007 | Huang |

FOREIGN PATENT DOCUMENTS

| WO | 2012/082452 A2 | 6/2012 |
| WO | 2012/082452 A3 | 10/2012 |

OTHER PUBLICATIONS

International Search Report and Written Opinion for PCT Patent Application No. PCT/US2011/063376, Mailed on Jul. 30, 2012, 10 pages.

\* cited by examiner

*Primary Examiner* — Tho D Ta
*Assistant Examiner* — Larisa Tsukerman
(74) *Attorney, Agent, or Firm* — Winkle, PLLC (57) ABSTRACT

The present description relates to the field of microelectronic device retention mechanisms and, more particularly, to a quick release retention mechanism including a base plate, a load plate and a biasing mechanism adapted to apply a desired load and to allow rapid insertion and extraction of microelectronic devices from sockets.

22 Claims, 9 Drawing Sheets

QUICK RELEASE RETENTION MECHANISM FOR SOCKETED MICROELECTRONIC DEVICES

BACKGROUND

Embodiments of the present description generally relate to the field of microelectronic device retention mechanisms and, more particularly, to a quick release retention mechanism including a base plate, a load plate and a biasing mechanism adapted to apply a desired load and to allow rapid insertion and extraction of microelectronic devices from sockets.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

Embodiments of the present description relate to the field of microelectronic device retention mechanisms and, more particularly, to a quick release retention mechanism including a base plate, a load plate and a biasing mechanism adapted to apply a desired load and to allow rapid insertion and extraction of microelectronic devices from sockets.

Figure 1:
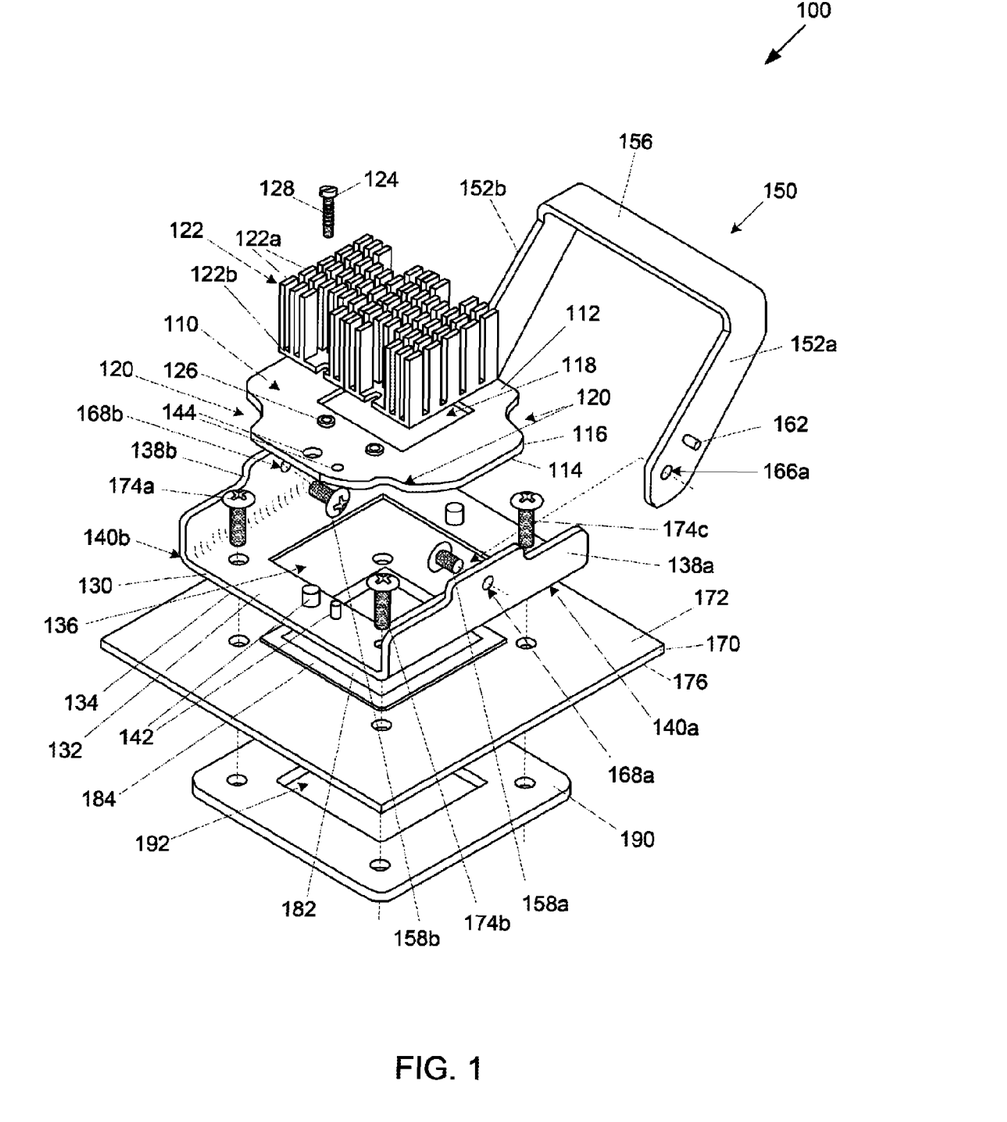
FIG. 1 illustrates an oblique, exploded view of a retention mechanism of the present description.

FIG. 1 illustrates an oblique, exploded view of a retention mechanism 100 of the present description. The retention mechanism 100 may comprise a load plate 110, a base plate 130, and a biasing mechanism 150 for the load plate 110. The load plate 110 may have a first surface 112, an opposing second surface 114, and a periphery 116. The load plate 110 may also include an opening 118 defined through the load plate 110 from the load plate first surface 112 to the load plate second surface 114. The load plate 110 may be made of any appropriate, substantially rigid material, including but not limited to metal, high density polymer, carbon fiber, and the like. In one embodiment, the load plate 110 may be made from a high thermal conductively metal, including but not limited to aluminum, copper, and the like, and may be fabricated by stamping sheet metal.

A heat dissipation mechanism 122 may be attached to the load plate first surface 112 to span the load plate opening 118. The heat dissipation mechanism 122 may be attached to the load plate 110 with at least one screw 124. The embodiment illustrated in FIG. 1 would have four screws 124; however, only one is shown to simplify the illustration. The heat dissipation mechanism retention screw(s) 124 may be screwed into at least one corresponding threaded opening 126 in or on the load plate first surface 112. The heat dissipation mechanism retention screw(s) 124 may include a biasing device 128, such as a spring wrapped around a threaded portion of the heat dissipation mechanism retention screw(s) 124. The biasing device(s) 128 may allow the heat dissipation mechanism 122 move and impart a desired load against any object that the heat dissipation mechanism 122 contacts.

The heat dissipation mechanism 122 may be have any appropriate configuration. In the illustrated embodiment, the heat dissipation mechanism 122 comprises a plurality of pillars 122a extending from a base 122b. The heat dissipation mechanism 122 may be made from any appropriate thermally conductive material, including, but not limited to, aluminum, copper, alloy thereof, and the like. An air circulation mechanism (not shown), such as a fan, may be positioned proximate the heat dissipation mechanism 122 to assist in removing heat from the heat dissipation mechanism pillars 122a, as will be understood to those skilled in the art.

The base plate 130 of the retention mechanism 100 may have a first surface 132, an opposing second surface 134, and an opening 136 defined through the base plate 130. The base plate 130 may further have at least one flange (shown as two flanges, first flange 138a and second flange 138b) extending substantially perpendicularly from the base plate first surface 132. As illustrated, the base plate first flange 138a and the base plate second flange 138b may be on opposing edges 140a and 140b of the base plate 130 with base plate opening 136 disposed therebetween. The base plate 130 may be made of any appropriate, substantially rigid material, including but not limited to metal, high density polymer, carbon fiber, and the like.

The base plate 130 and the load plate 110 may include a mechanism for aligning the load plate 110 to the base plate 130. In one embodiment, the base plate 130 may include at least one alignment pin 142 extending from the base plate first surface 132. The load plate 110 may include at least one alignment opening 144 to receive the base plate alignment pin(s) 142. It is understood that the load plate 110 could have the alignment pins and the base plate 130 could have the alignment openings.

The biasing mechanism 150 may be any mechanism that can provide a desired load to the load plate 110. As illustrated in FIG. 1, the biasing mechanism 150 can be a dual cam device, having a first cam 152a and a second cam 152b with a lever handle 156 attaching the first cam 152a to the second cam 152b, such that the first cam 152a and the second cam 152b may operate in unison. The first cam 152a may be pivotally attached to the base plate first flange 138a, and the second cam 152b may be pivotally attached to the base plate second flange 138b. In the illustrated embodiment, the first cam 152a may be pivotally attached with a first pivot bolt 158a extending through a first cam hole 166a in the first cam 152a and a first flange hole 168a in the base plate first flange 138a, and the second cam 152b may be pivotally attached with a second pivot bolt 158b extending through a second cam hole (hidden) the second cam 152b and a second flange hole 168b in the base plate second flange 138b.

The second surface 134 of the base plate 130 may be placed on a first surface 172 of a substrate 170 and secured thereto with mounting mechanisms. In the illustrated embodiment, the base plate 130 may be secured to the substrate 170 with at least one mounting bolt (shown as mounting bolt 174a, 174b, and 174c (as well as a fourth obscured bolt 174d (shown in FIG. 6)). The substrate 170 may be any appropriate substrate including a printed circuit board, such as a motherboard or a microelectronic device testing substrate. The substrate 170 may include a microelectronic device 182 disposed in a socket 184. The base plate opening 136 may be sized to substantially surround the socket 184.

The microelectronic device 182 may include, but is not limited to, a central processing unit (CPU), a chipset, a graphics processor, an application specific integrated circuit (ASIC), or other command/data processing device. The socket 184 may be any appropriate socket for receiving a microelectronic device 182, including a central processing unit (CPU) sockets and metalized particle interconnect (MPI) sockets (generally used with chipset and ASIC applications). It is understood that the retention mechanism 100 may be used with any single or multi-device socket, such as a MCP (multi-chip processor).

A backing plate 190 may be placed on a second surface 176 of the substrate 170 (i.e. opposing the substrate first surface 172, wherein the mounting bolts 174a, 174b, and 174c (as well as the fourth obscured bolt 174d (shown in FIG. 6)) extend through the backing plate 190 and are secured thereto. The backing plate 190 may assist in distributing the load imparted by securing the base plate 130 with the mounting bolts 174a, 174b, and 174c (as well as the fourth obscured bolt 174d (shown in FIG. 6)) across the substrate second surface 176, which may assist in reducing the likelihood of stress damage to the substrate 170. The backing plate 190 may have an opening 192 defined therein, which may be used for back side probing, as will be understood to those skilled in the art.

Figure 2:
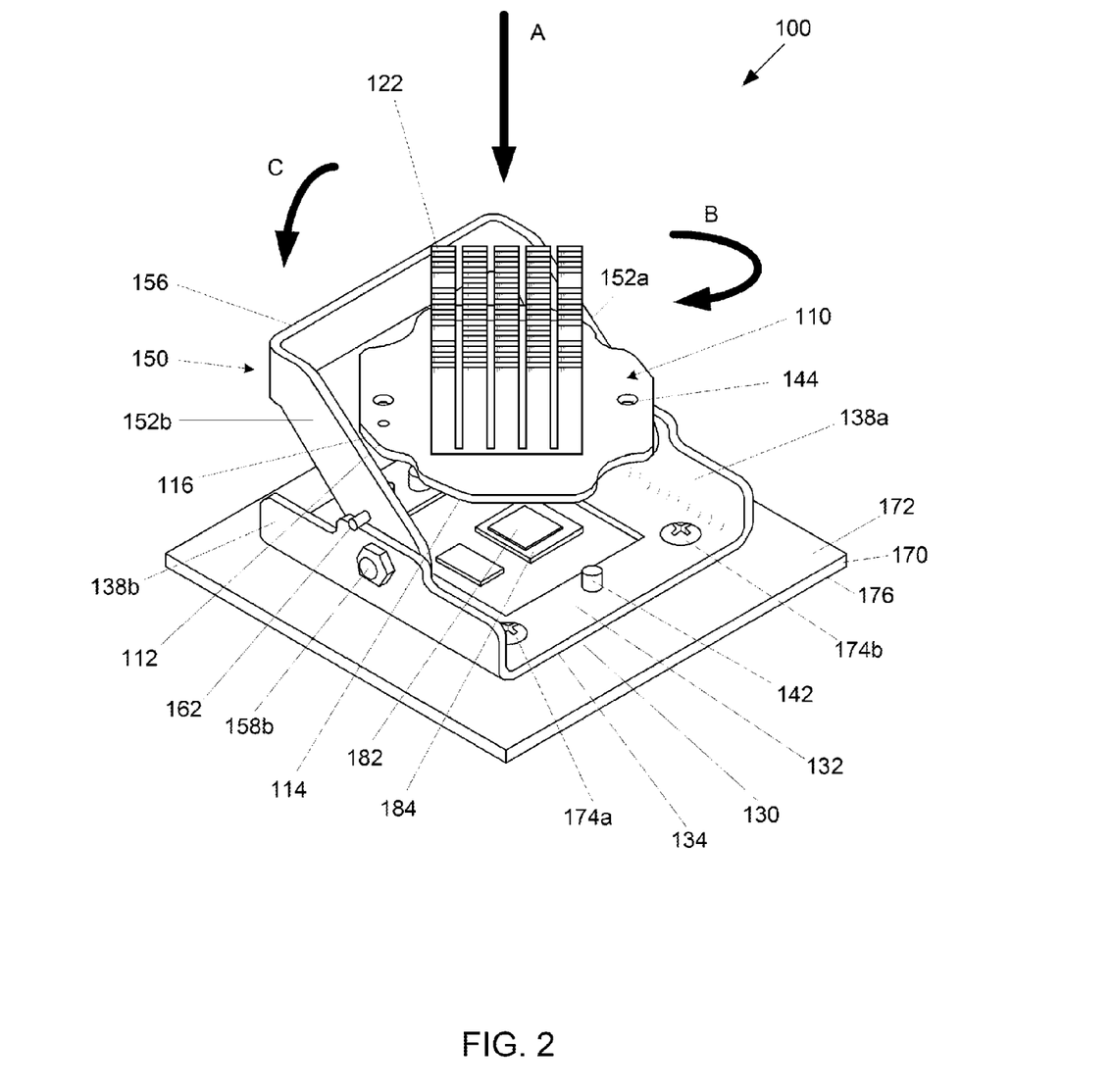
FIG. 2 illustrates an oblique view of the retention mechanism of FIG. 1 showing a drop and rotate process for attaching a load plate to a base plate, according to one embodiment of the present description.

As shown in FIGS. 1 and 2, the load plate periphery 116 may be shaped to allow "drop and rotate" insertion. The shaped load plate periphery 116 may be contoured at corners 120 thereof to provide room for the mounting bolts 174a, 174b, and 174c (as well as an obscured fourth bolts 174d (shown in FIG. 6)).

Figure 3:
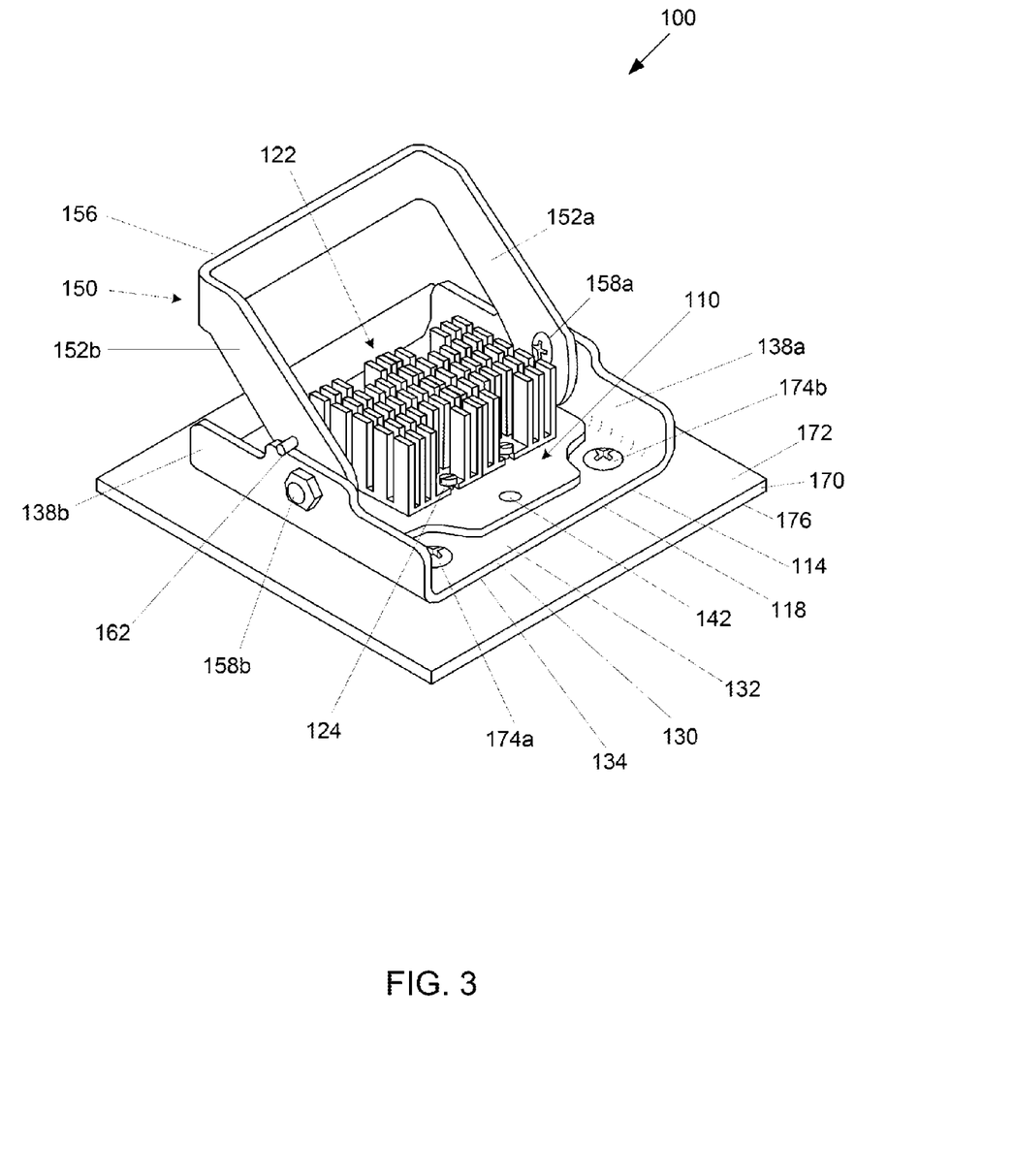
FIG. 3 illustrates an oblique view of a loaded retention mechanism of FIG. 1, according to one embodiment of the present description.

Referring to FIG. 2, the load plate 110 may be rotated about 45 degrees from its loaded position (see FIG. 3) relative to the base plate 130. The load plate 110 may then be lower adjacent the base plate 130 (illustrated by arrow A) then rotated about 45 degrees (illustrated by arrow B) to align and engage the alignment pins 142 with the alignment openings 144, which places the load plate 110 between the first cam 152a and the base plate first surface 132, and between the second cam 152b and the base plate first surface 132. The biasing mechanism 150 may be rotated (illustrated by arrow C) to engage the first cam 152a and the second cam 152b against the load plate first surface 112, which places a desired load against the microelectronic device 182. A stop pin 162 may be attached to either the first cam 152a (see FIG. 1) and/or the second cam 152b (see FIG. 2) to contact its respective base plate first flange 138a and/or base plate second flange 138b to stop the rotation of the biasing mechanism 150 at a desired position. This operation results in the loaded retention mechanism 100, as shown in FIG. 3. The embodiment illustrated in FIGS. 1-3 may be particularly applicable to smaller cooling solution "keep out volume" for lower power dissipating microelectronic devices, such as chipsets and application specific integrated circuit devices in metalized particle interconnect (MPI) sockets, as will be understood to those skilled in the art.

Figure 4:
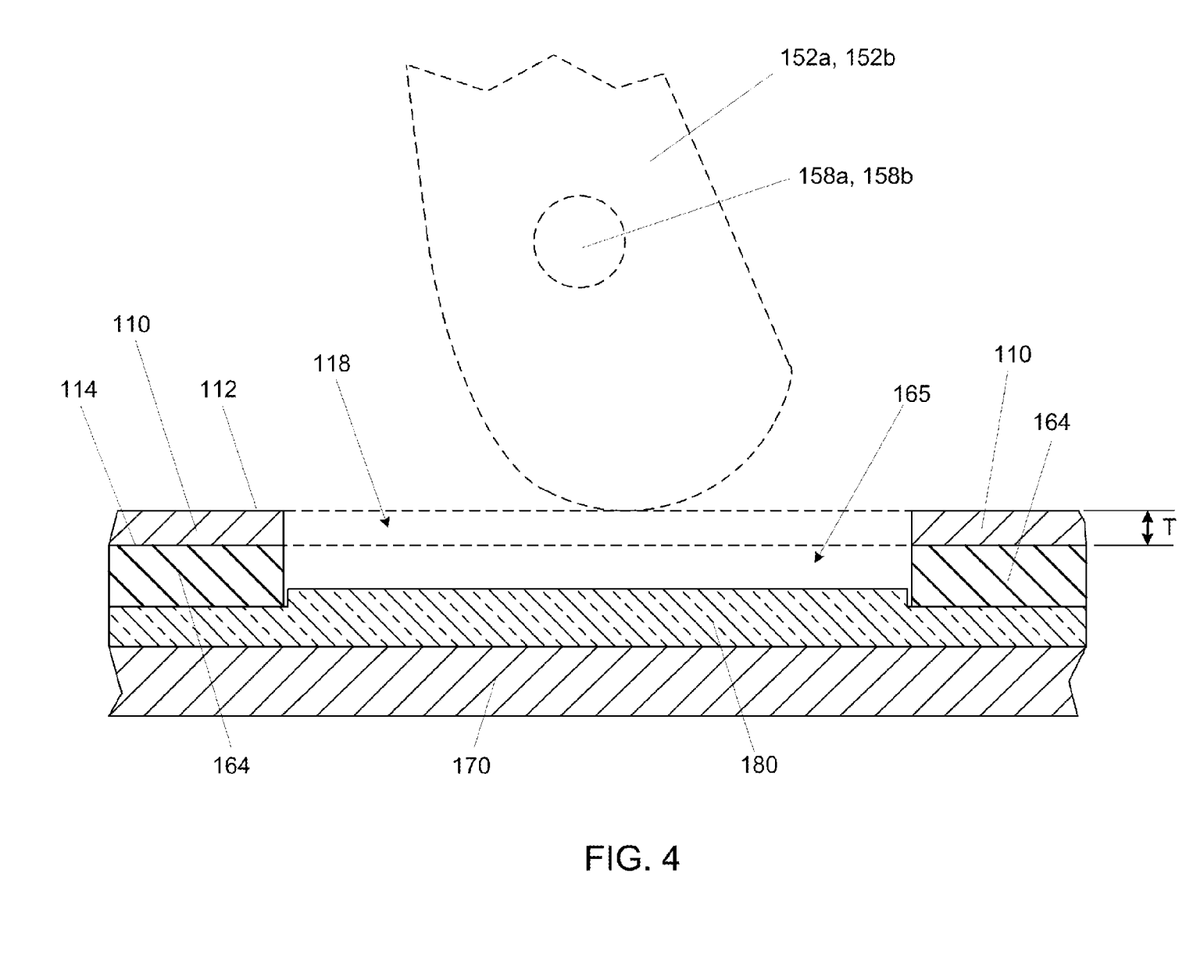
FIG. 4 illustrates a side cross-sectional view of a load plate loaded in a base plate and biased by a cam, according to an embodiment of the present description.

FIG. 4 illustrates a side cross sectional view of the biasing mechanism first cam 152a or biasing mechanism second cam 152b (shown in shadow lines) engaging the load plate first surface 112. An electrical insulation material 164 may be disposed between the load plate second surface 114 and the microelectronic device and/or a socket (shown collectively as element 180) on the substrate 170. The electrical insulation material 164 may have an opening 165 therethrough which is substantially aligned with opening in the load plate opening 118 (shown in shadow lines) to expose any thermally sensitive components or portions of the microelectronic device, such thermal contact may be made with the heat dissipation device 122 (see FIG. 1). The electrical insulation material 164 may prevent electrical short circuit of any circuits on the microelectronic device and/or a socket (collectively element 180). The electrical insulation material 164 may be attached to the load plate second surface 114. The load placed on the load plate 110 may be changed by changing the thickness T of the load plate 110 and, referring also to FIG. 1, by changing a diameter of the first pivot bolt 158a and a diameter of the second pivot bolt 158b and their respective first cam hole 166a and first flange hole 168b, and second cam hole (hidden) and second flange hole 168b. Thus, the load to the microelectronic device 182 in the socket may be self-regulating, requiring no special tools or operator training.

As will be understood by those skilled in the art, the embodiments of the present description may be used for testing microelectronic devices or for a final assembly in a computer system or a computer server. With regard to microelectronic device testing (debug and validation), the retention mechanisms may allow for quick assembly and disassembly by replacing commonly used spring screw retention hardware. Additionally, the application of a uniform load by the retention mechanisms of the present description may increase the reliability of the socket, may reduce the potential of cracking or damaging a microelectronic device, and, may increase the number of insertion and extraction cycles achievable from microelectronic device testing hardware.

Figure 5:
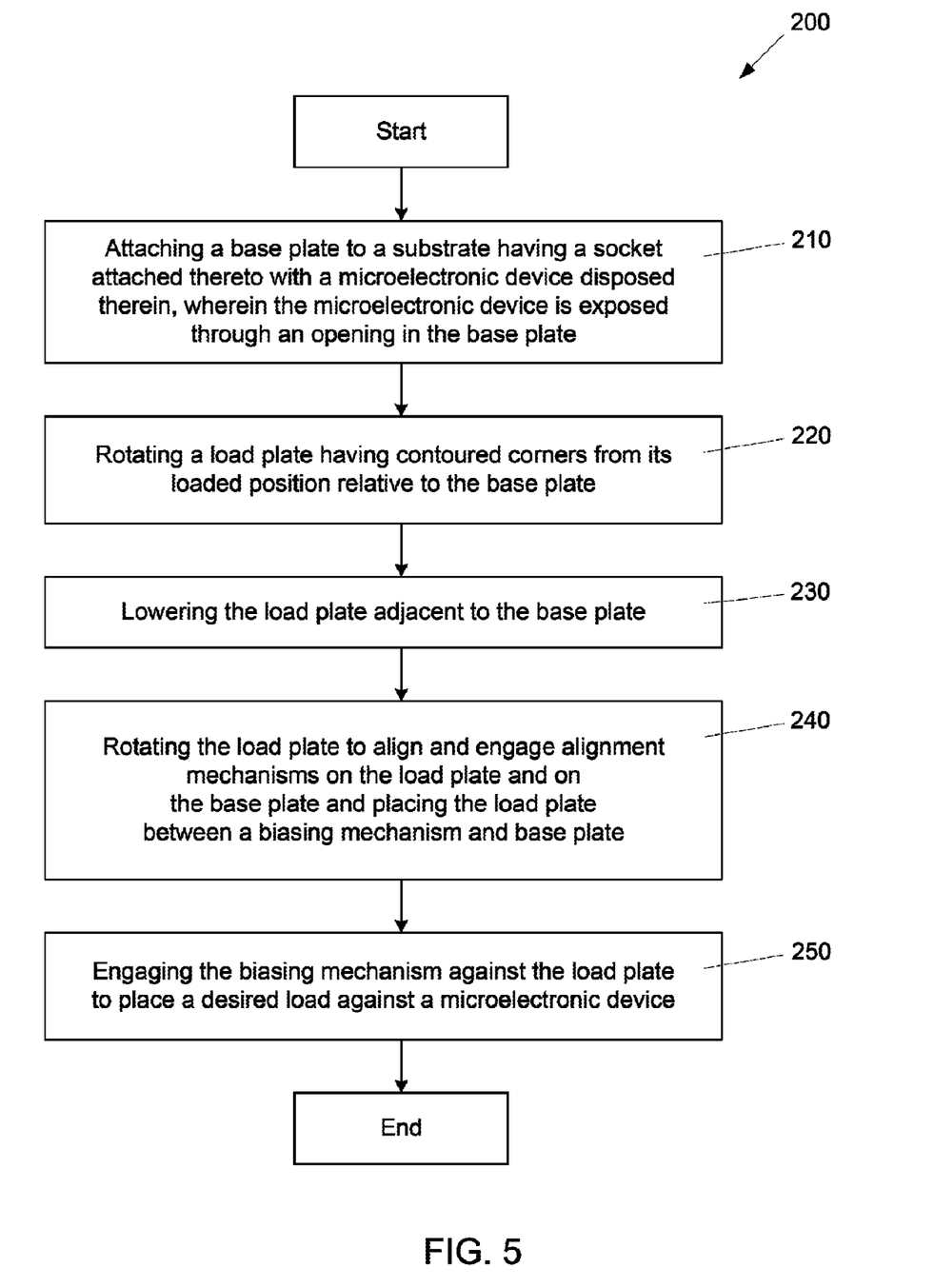
FIG. 5 is a flow chart of a process of loading a retention mechanism of FIGS. 1-4, according to an embodiment of the present description.

The process described for FIG. 2 is illustrated as process 200 in the flow chart of FIG. 5. As set forth in block 210, a base plate may be attached to a substrate, wherein the substrate has a socket attached thereto with a microelectronic device disposed therein, and wherein the microelectronic device is exposed through an opening in the base plate. As set forth in block 220, a load plate having contour corners may be rotated from its loaded position relative to a base plate. The load plate may then be lower adjacent to the base plate, as set forth in block 230, and then rotated to align and engage alignment mechanisms on the load plate and base plate, which places the load plate between a biasing mechanism and base plate, as set forth in block 240. As set forth in block 250, the biasing mechanism may be engaged against the load plate, which places a desired load against the microelectronic device.

Figure 6:
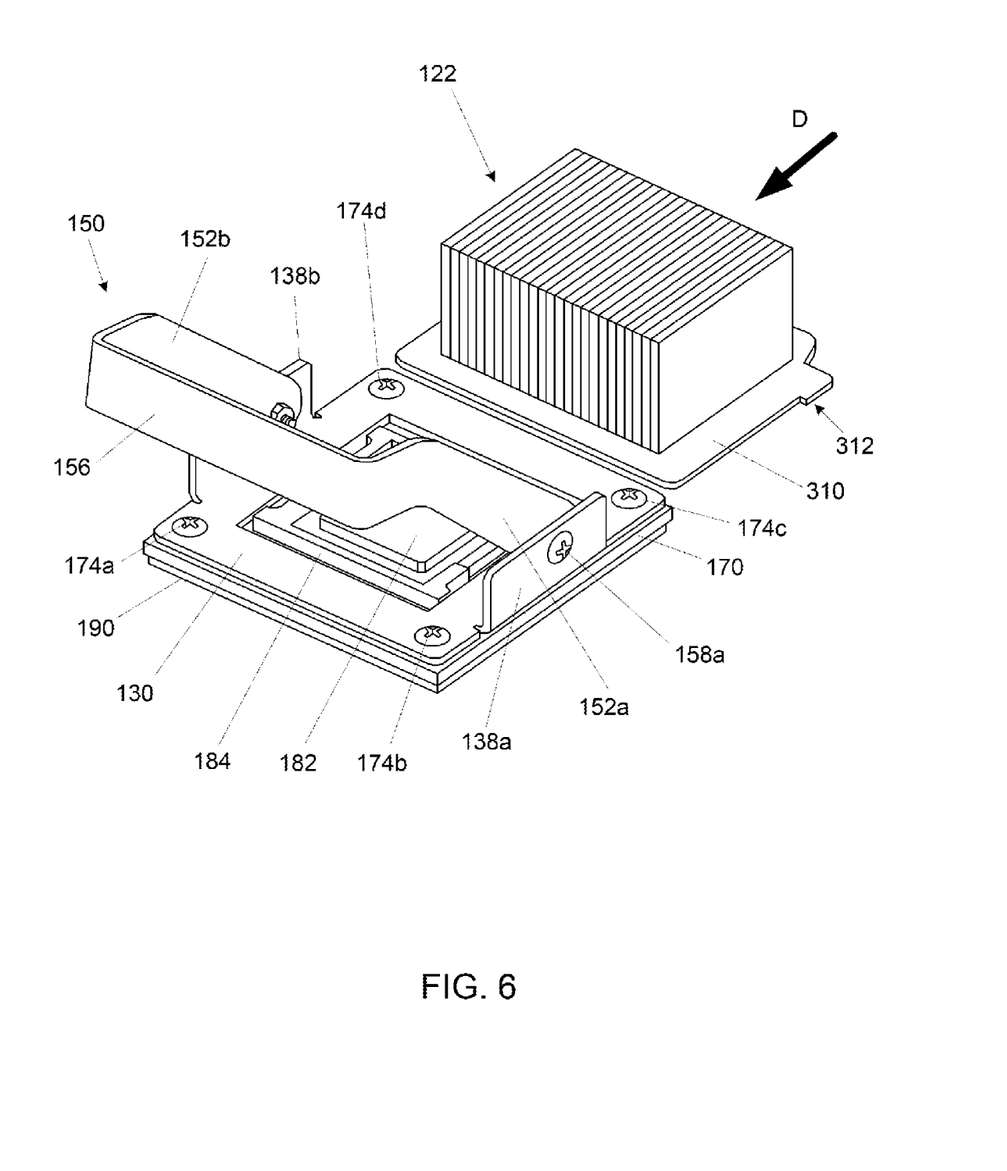
FIG. 6 illustrates an oblique view of a retention mechanism showing a sliding process for attaching a load plate to a base plate, according to another embodiment of the present description.
Figure 7:
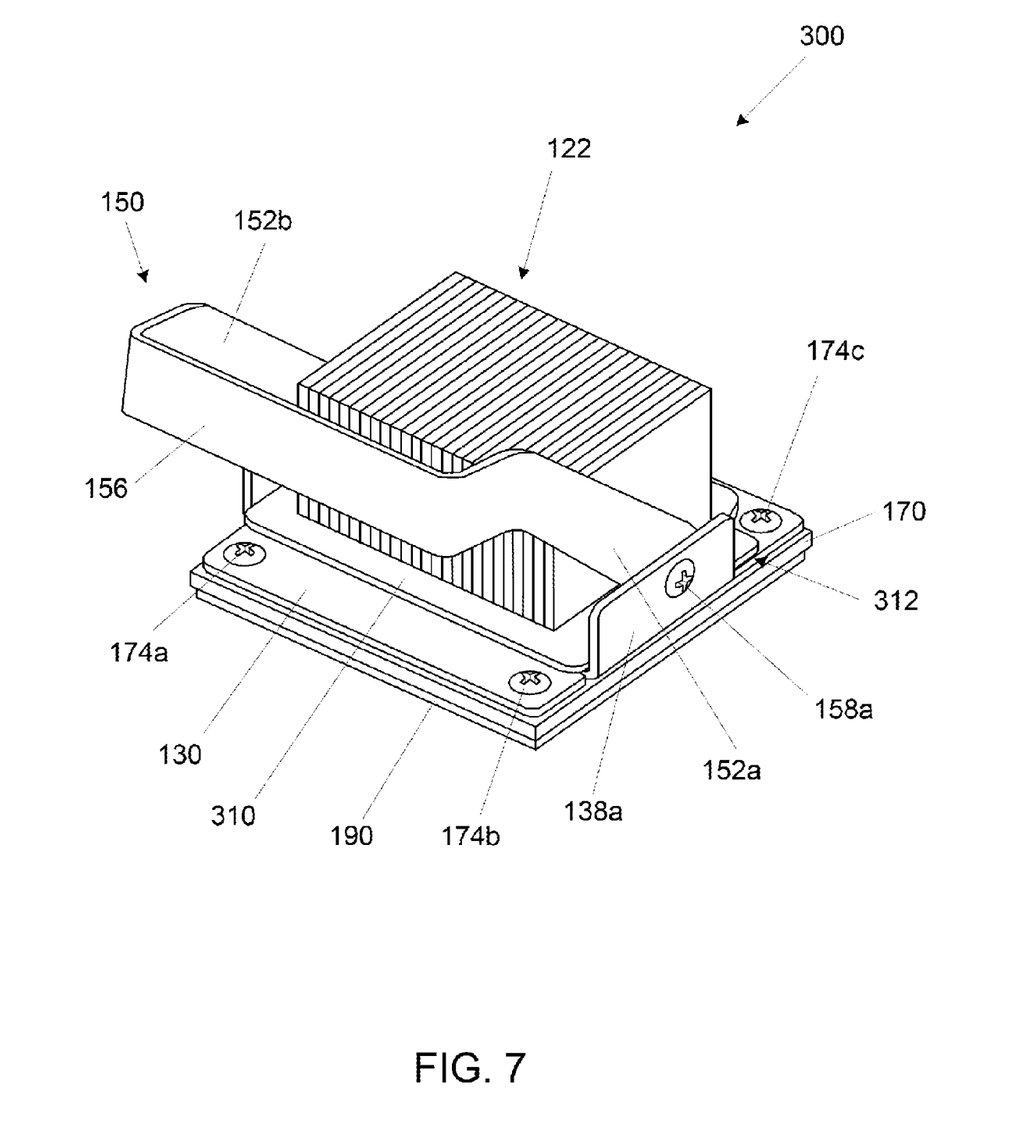
FIG. 7 illustrates an oblique view of a loaded retention mechanism of FIG. 6, according to one embodiment of the present description.

FIG. 6 illustrates a load plate 310 adapted to be slid into place on the base plate 130. The load plate 310 may include at least one stop projection 312 adapted to contact a stop structure of the base plate 120 thereby aligning the load plate 310 on the base plate 120. In the illustrated embodiment, the load plate 310 is slid (illustrated with arrow D) onto the base plate 130 until the load plate stop projection 312 contacts a base plate flange (e.g. base plate first flange 138a and/or base plate second flange 138b), which acts as the stop structure. The biasing mechanism 150 may then be rotated to engage the first cam 152a and the second cam 152b against the load plate first surface 112, which places a desired load against the microelectronic device 182, and results in the loaded retention mechanism 300 of FIG. 7. The embodiment illustrated in FIGS. 6 and 7 may be particularly applicable to larger "keep out volumes" for high power dissipation microelectronic devices, such as microprocessors, as will be understood to those skilled in the art.

Figure 8:
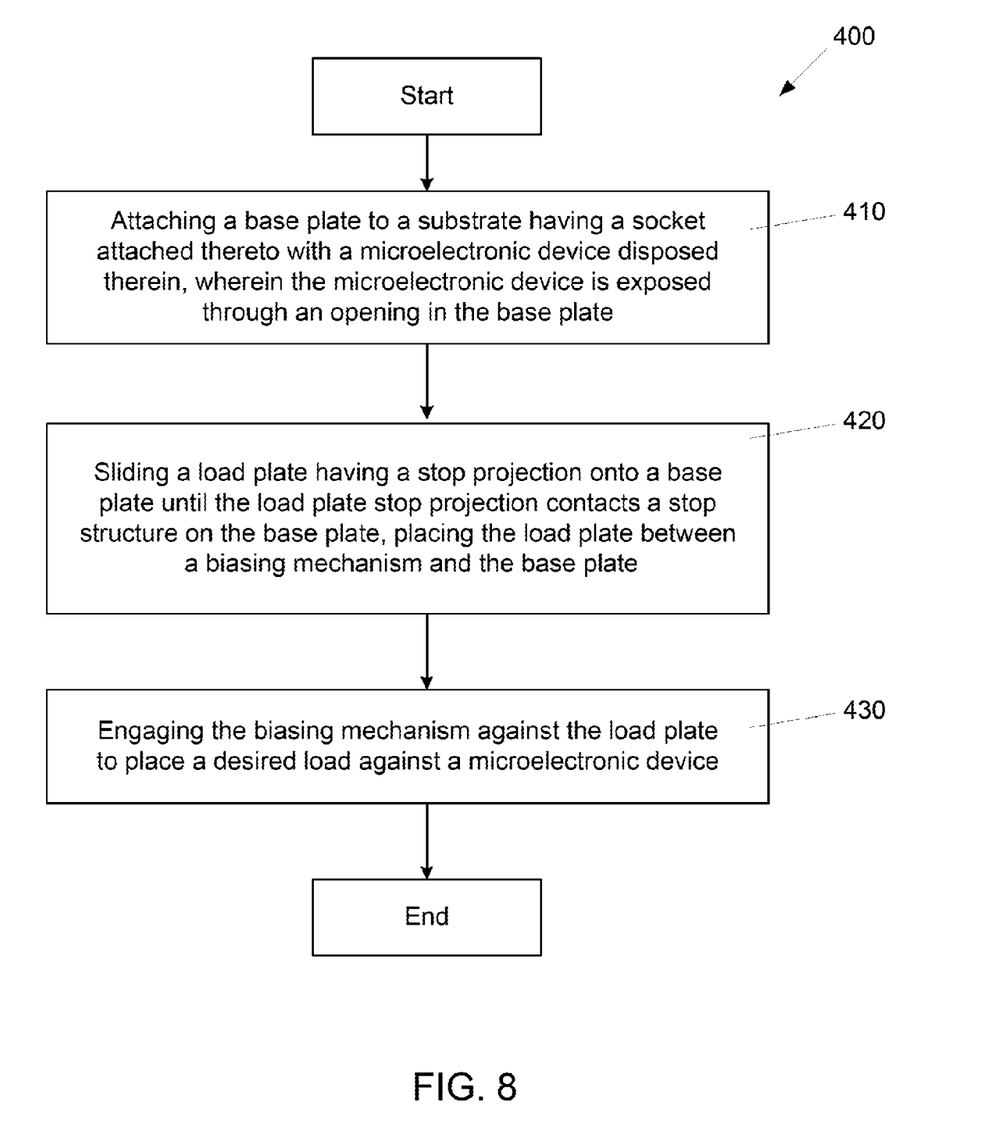
FIG. 8 is a flow chart of a process of loading a retention mechanism of FIG. 6, according to an embodiment of the present description.

The process of described for FIG. 6 is illustrated as the process 400 in the flow chart of FIG. 8. As set forth in block 410, a base plate may be attached to a substrate, wherein the substrate has a socket attached thereto with a microelectronic device disposed therein, and wherein the microelectronic device is exposed through an opening in the base plate. As set forth in block 420, a load plate having a stop projection is slid onto a base plate until the load plate stop projection contacts a stop structure on the base plate, which places the load plate between a biasing mechanism and the base plate. As set forth in block 420, the biasing mechanism may be engaged against the load plate, which places a desired load against a microelectronic device.

Figure 9:
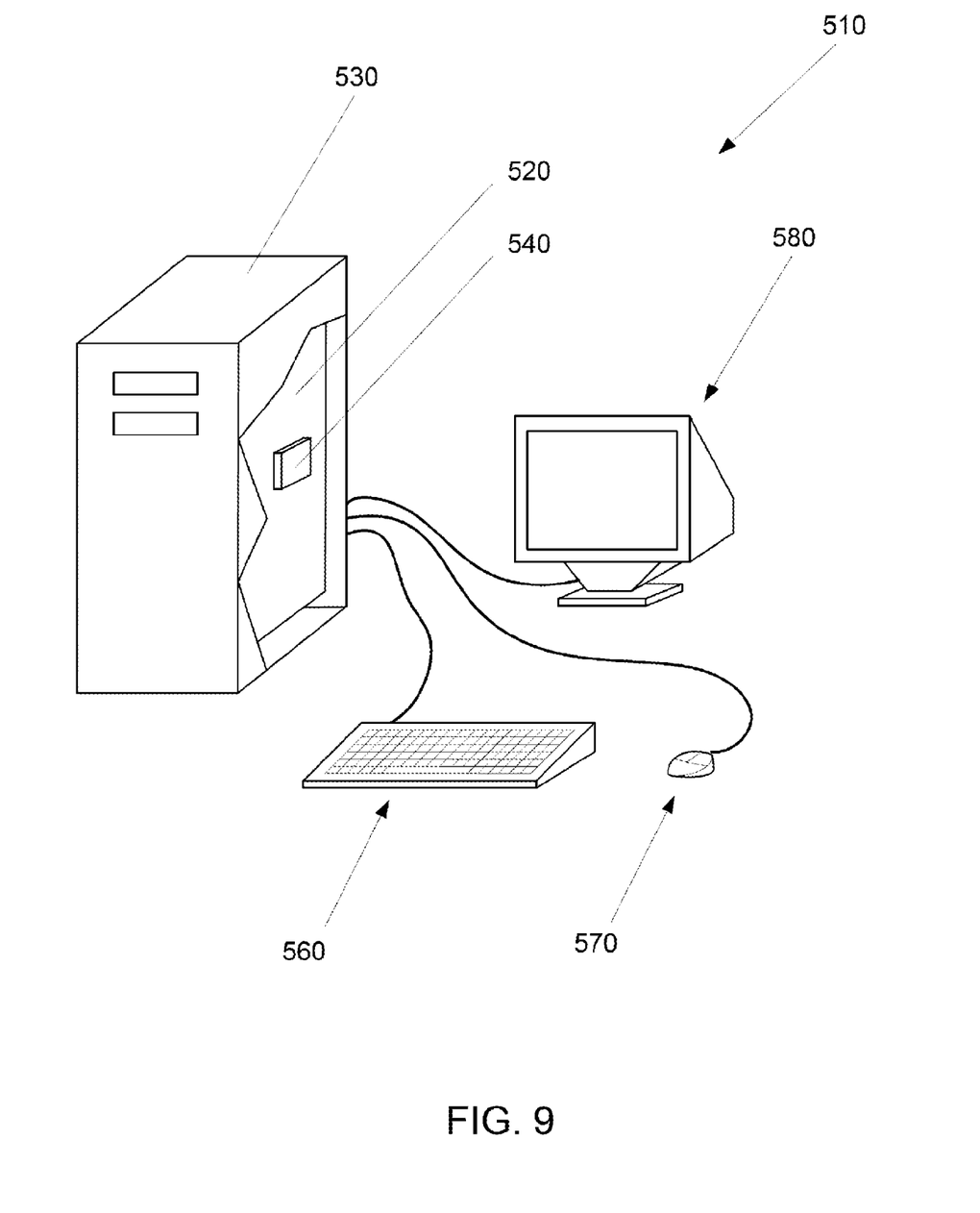
FIG. 9 illustrates a computer system, according to one embodiment of the present description.

FIG. 9 illustrates an embodiment of a computer system 510. The computer system 510 may comprise a substrate or motherboard 520 within a housing 530. The motherboard 520 may have various electronic component electrically coupled thereto including a microelectronic device, such as a central processing units (CPUs), chipsets, graphics processor, ASICs, or other command/data processing device, within a socket and retained with a retention mechanism of the present description. The microprocessor, socket, and retention mechanism are shown generically as element 540 (details of these components have been shown in FIGS. 1-4, 6, and 7). The substrate or motherboard 520 may be attached to various peripheral devices including inputs devices, such as a keyboard 560 and/or a mouse 570, and a display device, such as a monitor 580.

It is also understood that the subject matter of the present description is not necessarily limited to specific applications illustrated in FIGS. 1-9. The subject matter may be applied to other microelectronic applications. Furthermore, the subject matter may also be used in any appropriate application outside of the microelectronic device fabrication field, as will be understood to those skilled in the art.

The detailed description has described various embodiments of the devices and/or processes through the use of illustrations, block diagrams, flowcharts, and/or examples. Insofar as such illustrations, block diagrams, flowcharts, and/or examples contain one or more functions and/or operations, it will be understood by those skilled in the art that each function and/or operation within each illustration, block diagram, flowchart, and/or example can be implemented, individually and/or collectively, by a wide range of hardware, software, firmware, or virtually any combination thereof.

The described subject matter sometimes illustrates different components contained within, or connected with, different other components. It is understood that such illustrations are merely exemplary, and that many alternate structures can be implemented to achieve the same functionality. In a conceptual sense, any arrangement of components to achieve the same functionality is effectively "associated" such that the desired functionality is achieved. Thus, any two components herein combined to achieve a particular functionality can be seen as "associated with" each other such that the desired functionality is achieved, irrespective of structures or intermediate components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

It will be understood by those skilled in the art that terms used herein, and especially in the appended claims are generally intended as "open" terms. In general, the terms "including" or "includes" should be interpreted as "including but not limited to" or "includes but is not limited to", respectively. Additionally, the term "having" should be interpreted as "having at least".

The use of plural and/or singular terms within the detailed description can be translated from the plural to the singular and/or from the singular to the plural as is appropriate to the context and/or the application.

It will be further understood by those skilled in the art that if an indication of the number of elements is used in a claim, the intent for the claim to be so limited will be explicitly recited in the claim, and in the absence of such recitation no such intent is present. Additionally, if a specific number of an introduced claim recitation is explicitly recited, those skilled in the art will recognize that such recitation should typically be interpreted to mean "at least" the recited number.

The use of the terms "an embodiment," "one embodiment," "some embodiments," "another embodiment," or "other embodiments" in the specification may mean that a particular feature, structure, or characteristic described in connection with one or more embodiments may be included in at least some embodiments, but not necessarily in all embodiments.

The various uses of the terms "an embodiment," "one embodiment," "another embodiment," or "other embodiments" in the detailed description are not necessarily all referring to the same embodiments.

While certain exemplary techniques have been described and shown herein using various methods and systems, it should be understood by those skilled in the art that various other modifications may be made, and equivalents may be substituted, without departing from claimed subject matter or spirit thereof. Additionally, many modifications may be made to adapt a particular situation to the teachings of claimed subject matter without departing from the central concept described herein. Therefore, it is intended that claimed subject matter not be limited to the particular examples disclosed, but that such claimed subject matter also may include all implementations falling within the scope of the appended claims, and equivalents thereof.

What is claimed is:

1. A retention mechanism comprising:
a base plate having a first surface and an opposing second surface, an opening defined therein, a first flange and a second flange extending from the base plate first surface on opposing edges of the base plate;
a biasing mechanism comprising a first cam pivotably attached to the base plate first flange and a second cam pivotably attached to the base plate second flange; and
a load plate adapted to reside between the base plate first surface and biasing mechanism, and span the base plate opening.

2. The retention mechanism of claim 1, wherein the load plate includes a first surface, an opposing second surface, and a contoured periphery.

3. The retention mechanism of claim 2, wherein the load plate and the base plate further include alignment structures.

4. The retention mechanism of claim 2, wherein the load plate includes a heat dissipation mechanism.

5. The retention mechanism of claim 1, wherein the load plate includes a stop projection.

6. The retention mechanism of claim 5, wherein the load plate stop projection is adapted to contact a stop structure on the base plate to align the load plate.

7. The retention mechanism of claim 5, wherein the load plate includes a heat dissipation mechanism.

8. The retention mechanism of claim 1, further comprising a lever handle connecting the biasing mechanism first cam to the biasing mechanism second cam.

9. The retention mechanism of claim 1, further comprising a backing plate attached to the base plate.

10. The retention mechanism of claim 9, wherein the backing plate has an opening defined therethrough.

11. A method of loading a retention mechanism comprising:
attaching a base plate to a substrate, wherein the substrate has a socket attached thereto with a microelectronic device disposed therein, wherein the microelectronic device is exposed through an opening in the base plate, wherein the base plate has a first flange and a second flange extending therefrom on opposing edges of the base plate;
rotating a load plate having contoured corners from its loaded position relative to the base plate
lowering the load plate adjacent to the base plate
rotating the load plate to align and engage alignment mechanisms on the load plate and on the base plate and placing the load plate between a biasing mechanism and base plate, wherein the biasing mechanism comprises a first cam pivotably attached to the base plate first flange and a second cam pivotably attached to the base plate second flange; and
engaging the first cam and the second cam of the biasing mechanism against the load plate to place a desired load against the microelectronic device.

12. A method of loading a retention mechanism comprising:
attaching a base plate to a substrate, wherein the substrate has a socket attached thereto with a microelectronic device disposed therein, wherein the microelectronic device is exposed through an opening in the base plate, wherein the base plate has a first flange and a second flange extending therefrom on opposing edges of the base plate;
sliding a load plate having a stop projection onto a base plate until the load plate stop projection contacts a stop structure on the base plate, placing the load plate between a biasing mechanism and the base plate, wherein the biasing mechanism comprises a first cam pivotably attached to the base plate first flange and a second cam pivotably attached to the base plate second flange; and
engaging the first cam and the second cam of the biasing mechanism against the load plate to place a desired load against the microelectronic device.

13. A system, comprising:
a substrate has a socket attached thereto and a microelectronic device disposed within the socket; and
a retention mechanism attached to the substrate, comprising:
a base plate having a first surface and an opposing second surface, an opening defined therein, a first flange and a second flange extending from the base plate first surface on opposing edges of the base plate, wherein the base plate opening substantially surrounds the substrate socket;
a biasing mechanism comprising a first cam pivotably attached to the base plate first flange and a second cam pivotably attached to the base plate second flange; and
a load plate adapted to reside between the base plate first surface and biasing mechanism, and span the base plate opening to contact the microelectronic device.

14. The system of claim 13, wherein the load plate includes a contoured periphery.

15. The system of claim 14, wherein the load plate and the base plate further include alignment structures.

16. The system of claim 14, wherein the load plate includes a heat dissipation mechanism.

17. The system of claim 13, wherein the load plate includes a stop projection.

18. The system of claim 17, wherein the load plate stop projection is adapted to contact a stop structure on the base plate to align the load plate.

19. The system of claim 17, wherein the load plate includes a heat dissipation mechanism.

20. The system of claim 13, further comprising a lever handle connecting the biasing mechanism first cam to the biasing mechanism second cam.

21. The system of claim 13, further comprising a backing plate attached to the base plate.

22. The system of claim 21, wherein the backing plate has an opening defined therethrough.

* * * * *